(12) United States Patent
Kundalgurki

(10) Patent No.: US 9,583,665 B2
(45) Date of Patent: Feb. 28, 2017

(54) PIN DIODE WITH NANOCLUSTERS

(71) Applicant: Srivatsa G. Kundalgurki, Austin, TX (US)

(72) Inventor: Srivatsa G. Kundalgurki, Austin, TX (US)

(73) Assignee: NXP USA, Inc., Austin, TX (US)

( * ) Notice: Subject to any disclaimer, the term of this patent is extended or adjusted under 35 U.S.C. 154(b) by 167 days.

(21) Appl. No.: 14/476,957

(22) Filed: Sep. 4, 2014

(65) Prior Publication Data

US 2016/0071997 A1   Mar. 10, 2016

(51) Int. Cl.
| | |
|---|---|
| *H01L 27/14* | (2006.01) |
| *H01L 31/00* | (2006.01) |
| *H01L 31/115* | (2006.01) |
| *G01T 3/08* | (2006.01) |
| *H01L 31/0216* | (2014.01) |
| *H01L 31/0232* | (2014.01) |
| *H01L 31/105* | (2006.01) |

(52) U.S. Cl.
CPC .............. *H01L 31/115* (2013.01); *G01T 3/08* (2013.01); *H01L 31/02161* (2013.01); *H01L 31/02327* (2013.01); *H01L 31/105* (2013.01); *Y02P 70/521* (2015.11)

(58) Field of Classification Search
CPC ... H01L 29/868; H01L 33/0012; H01L 31/11; H01L 31/113; H01L 31/117; H01L 31/02327; H01L 31/02161; H01L 31/105; H01L 31/115; G01T 3/08
USPC ...... 257/458, E29.336, 656, 428; 438/56, 57
See application file for complete search history.

(56) References Cited

U.S. PATENT DOCUMENTS

| | | | |
|---|---|---|---|
| 5,217,595 A | 6/1993 | Smith et al. | |
| 7,414,245 B2 | 8/2008 | Trissel | |
| 7,855,780 B1 | 12/2010 | Djeu | |
| 8,492,722 B2 | 7/2013 | Chang et al. | |
| 8,569,703 B2 | 10/2013 | Yu et al. | |
| 2011/0204323 A1* | 8/2011 | Espiau de Lamaestre ......... H01L 33/0041 257/13 | |

OTHER PUBLICATIONS

Ahmadi et al, "Theoretical Calculation of Radiation Induced Conductivity in Nanomaterials", IEEE International Conference on Nanotechnology, Aug. 15-18, 2011, pp. 1737-1740, Portland, Oregon.
Sohrabi et al, "A novel technique for rapid vapor detection using swelling polymer covered microstrip ring resonator", IEEE MTI-S International Microwave Symposium (IMS), Jun. 1-6, 2014, pp. 1-4, Tampa, FL.
Shishiyanu et al, "Novel Zinc Oxide Nanostructured thin Films for Volatile Organic Compaunds Gas Sensors", International Semiconductor Conference, Sep. 27-29, 2006, pp. 201-204, vol. 1.
Kanda et al, "Development ofVOC analyzer using a W03 thick film based gas sensor", Proceedings of IEEE Sensors, Oct. 24-27, 2004, pp. 1187-1190, vol. 3.

(Continued)

*Primary Examiner* — Thien F Tran

(57) ABSTRACT

A diode for detecting the presence of radiation includes a P region, an N region, an intrinsic region located between the P region and the N region, and a layer of nanoclusters located adjacent to the intrinsic region.

18 Claims, 7 Drawing Sheets

(56) References Cited

OTHER PUBLICATIONS

Elmi et al, "Ultra Low Power MOX Sensors with ppb-Level VOC Detection Capabilities", IEEE Sensors, Oct. 28-31, 2007, pp. 170-173, Atlanta, GA.
Dong et al, "Design of the photo-ionization detector of total hydrocarbon", International Conference on Optoelectronics and Microelectronics (ICOM), Sep. 7-9, 2013, pp. 98-100, IEEE, Harbin.
Greenshields, M.W.C.C. et al., AC-Conductance and Capacitance Measurements for Ethanol Vapor Detection Using Carbon Nanotube-Polyvinyl Alcohol Composite Based Devices, 2011, Journal of Nanoscience and Nanotechnology, vol. 11, pp. 2384-2388.
Office Action—Restricition/Election for U.S. Appl. No. 14/625,008 May 4, 2016, 6 pages.
U.S. Appl. No. 14/625, 008, filed Feb. 18, 2015.
U.S. Appl. No. 14/837, 147, filed Aug. 27, 2015.
U.S. Appl. No. 14/625,008, Final Rejection Office Action, mailed Jul. 20, 2016, 9 pages.
Notice of Allowance for U.S. Appl. No. 14/625,008 Sep. 30, 2016, 11 pages.
Office Action for U.S. Appl. No. 14/837,147 Jan. 5, 2017, 12 pages.

\* cited by examiner

PIN DIODE WITH NANOCLUSTERS

FIELD OF THE INVENTION

The disclosure relates generally to semiconductor processes and devices, and more particularly to methods for forming semiconductor devices having nanoclusters, and to PIN diodes with nanoclusters used in sensing devices.

BACKGROUND OF THE INVENTION

A PIN diode is a semiconductor diode with a lightly doped intrinsic semiconductor region in a substrate between a p-type region and an n-type region. When radiation or charged particles of sufficient energy impact the intrinsic region, an electron-hole pair is created that generates current between the p-type and n-type regions. The PIN diode can be used to detect photons as well as various types of charged particles including alpha particles and beta particles in a variety of sensors, such as radon sensors, radiation sensors, light sensors, and smoke detectors, among others. One difficulty with using PIN diodes for sensors is the lack of sensitivity to detect indirectly ionizing neutrons because the impact of a neutron in the intrinsic region does not directly generate current as neutrons are electrically neutral. Additionally, the usefulness of a sensor is often proportional to the sensitivity of the PIN diode. It is therefore desirable to provide PIN diodes with enhanced levels of sensitivity, and with the ability to detect neutrons in addition to charged particles and photons.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Embodiments disclosed herein provide an enhanced PIN diode detector with a silicon nanocluster-based scattering and electrically polarized primary interaction top layer (PIL) for enhanced photo and ionization detection. The nanoclusters are three-dimensional surfaces with high surface area encapsulated with dielectric to serve as physical scattering sites for incoming photon radiation. Compared to two-dimensional scattering sites, the increased surface area of the three-dimensional nanoclusters enhances absorption of the radiation in the underlying intrinsic region. Additionally, the interacting nanocrystal dipoles in the enhanced PIN diode electric field induces deflection of charged particles such as alpha and beta particles in to the sensing volume, which further enhances the probability of detecting them. Still further, boron ($^{10}$B) isotope used as a nanocluster dopant generates ionizing alpha particles upon interaction with neutron radiation thereby enabling indirect detection of neutrons, which are otherwise hard to detect.

Figure 1:
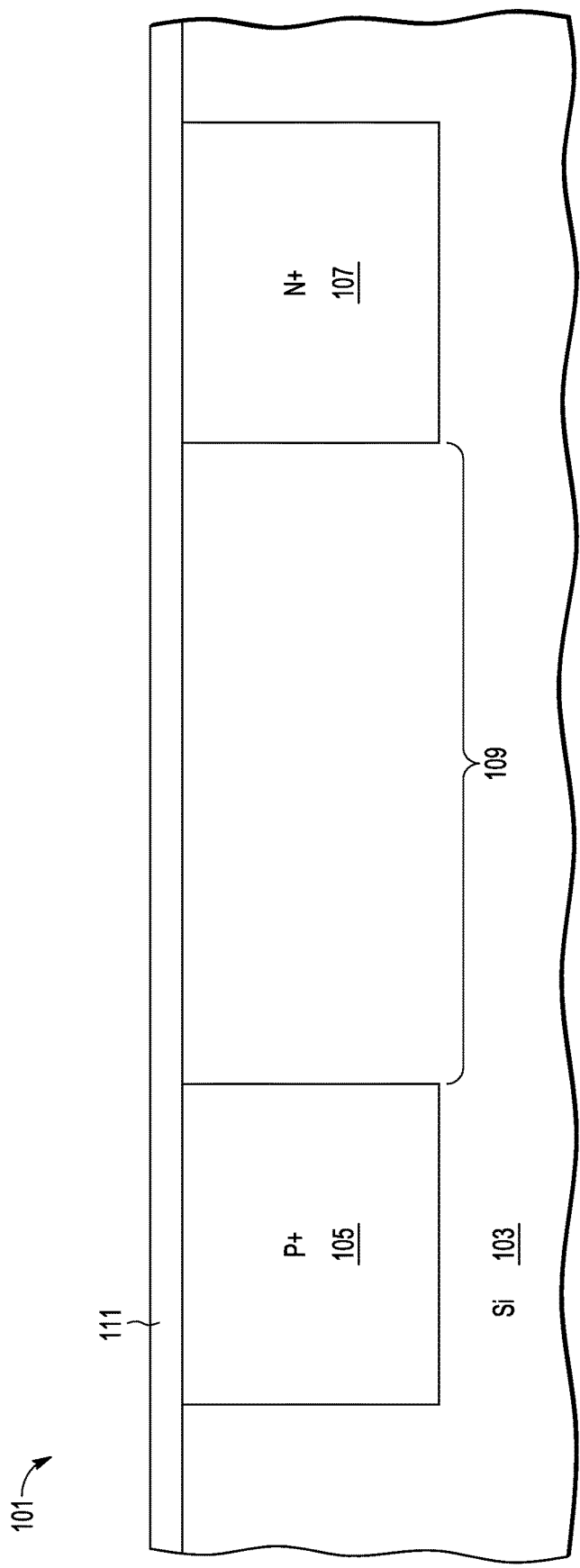
FIG. 1 is a cross-sectional side view of a portion of a PIN diode, at an intermediate stage of manufacture, according to an embodiment of the invention.

FIG. 1 is a cross-sectional side view of a portion of a PIN diode 101, at an intermediate stage of manufacture, according to an embodiment of the invention that includes substrate 103 with p-type doped region (also referred to at P region) 105, n-type doped region (also referred to as N region) 107, intrinsic region 109, and insulating (also called oxide or dielectric) layer 111. P-type doped region 105 and n-type doped region 107 extend from a first major surface of substrate 103 to an intermediate level within substrate 103. For example, the n and p-type regions 105, 107 can be defined with P and B dopants via chain implantation to a depth of about 1 micron with a SIMS measured dopant concentration of about 2e18 atoms/cm$^3$. Intrinsic region 109 extends between and under regions 105 and 107.

The substrate 103 can be a semiconductor material or combination of materials such as, for example, polycrystalline silicon, monocrystalline silicon, amorphous silicon, gallium arsenide, silicon germanium, silicon-on-insulator (SOI), among other semiconductive material(s). For example, substrate 103 can be a 200 mm p-type silicon substrate with an intrinsic resistivity of 1000 ohm-cm.

Insulating layer 111 can be formed over substrate 103 using conventional growth or deposition processes. Insulating layer 111 can be, for example, SiO$_2$, HfAlO, HfO$_2$, ONO, SiON, SiN, or other dielectric or insulative material, including high dielectric constant material such as alumina, titanium dioxide, hafnium dioxide, tantalum dioxide, and the like. For example, insulating layer 111 can be a thin LPCVD thermal grown oxide layer with a thickness ranging from 30 to 100 Angstroms or other suitable thickness.

Figure 2:
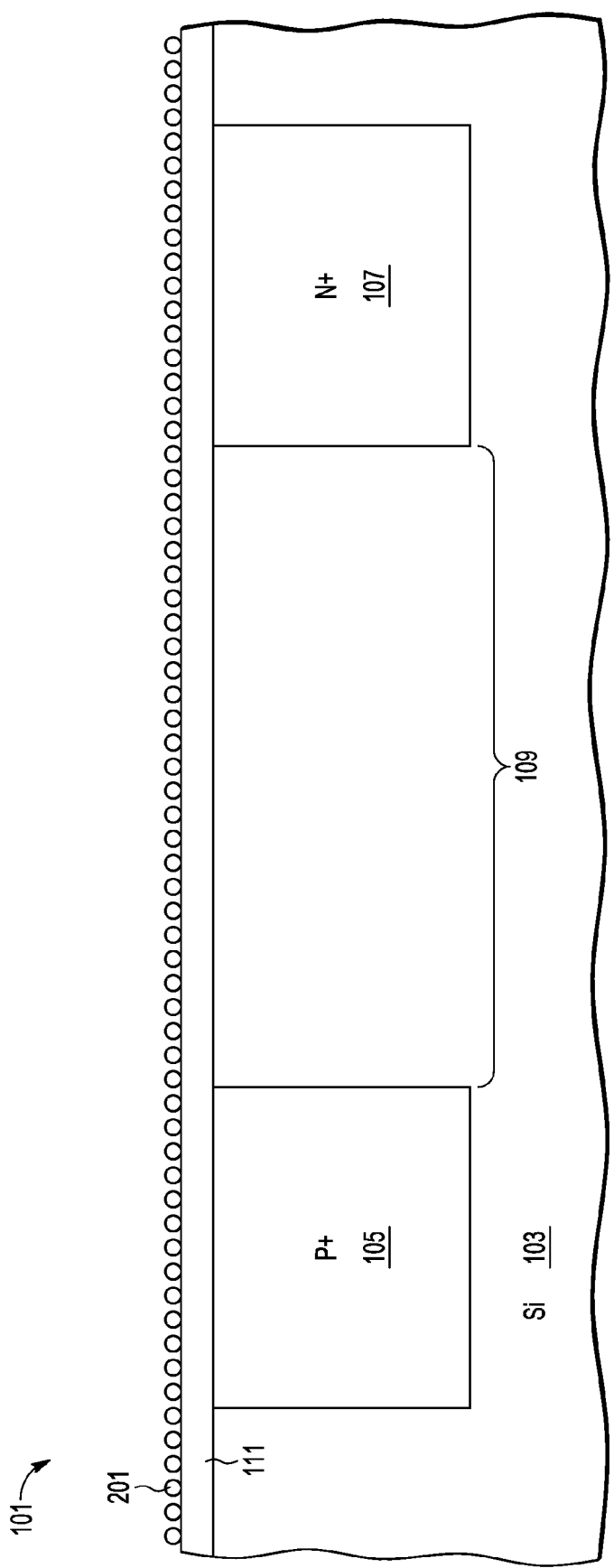
FIG. 2 is a cross-sectional side view of the PIN diode of FIG. 1, at a subsequent stage of manufacture, according to an embodiment of the invention.

FIG. 2 is a cross-sectional side view of the PIN diode of FIG. 1, at a subsequent stage of manufacture after a semiconductor layer 201 is deposited over insulating layer 111. The deposition step can be performed using chemical vapor deposition (CVD), plasma enhanced chemical vapor deposition (PECVD), epitaxy (EPI) or other methods. In an embodiment, the substrate 103 can be placed in a deposition chamber and a precursor gas flowed into the chamber to form a thin non-contiguous semiconductor layer 201 on the insulating layer 111. For example, an amorphous or a polysilicon layer 201 can be formed by flowing a silicon precursor gas, such as silane (SiH$_4$) or disilane (Si$_2$H$_6$), for example, using a conventional CVD process. Deposition time will generally determine the thickness of the deposited layer 201. In an embodiment, for example, the height or thickness of the semiconductor layer 201 (e.g., amorphous/polycrystalline silicon) can be about 3-20 nm. In general, the deposition temperature is not so high as to control the thickness and morphology of the semiconductor (e.g., amorphous silicon) layer 201.

Figure 3:
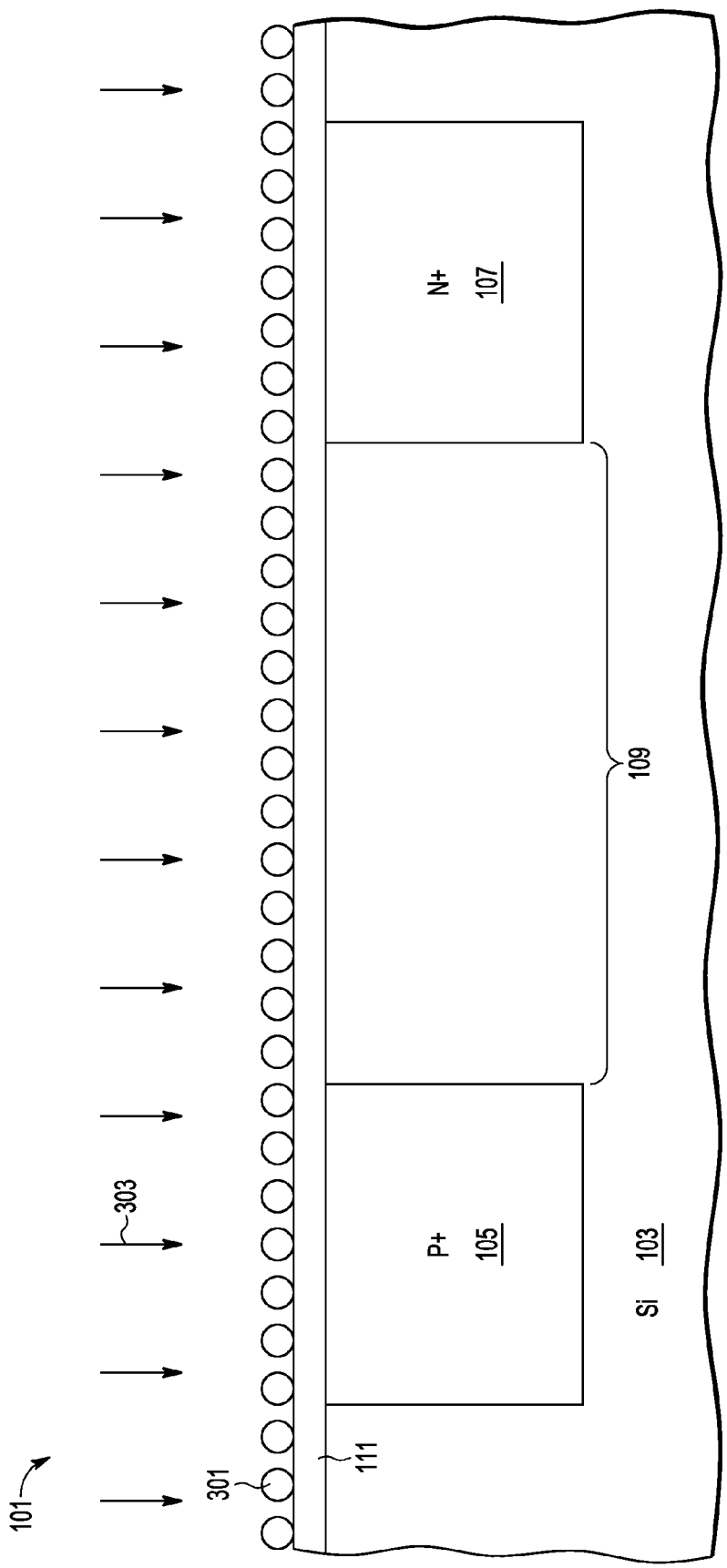
FIG. 3 is a cross-sectional side view of the PIN diode of FIG. 2, at a subsequent stage of manufacture, according to an embodiment of the invention.

FIG. 3 is a cross-sectional side view of the PIN diode of FIG. 2, at a subsequent stage of manufacture after which semiconductor layer 201 (e.g., amorphous/polycrystalline silicon) is annealed to form nanoclusters 301 of desirable shape and density. In an embodiment, the anneal of an amorphous/polysilicon layer 201 can be performed in an ambient (e.g., one or more gases) that does not contain oxygen. For example, the ambient can be nitrogen, an inert gas (e.g., argon), hydrogen or a combination thereof. By way of example, an anneal of amorphous/polysilicon layer 201 can be performed at a temperature of about 600-1000° C., for a time period of about 5-300 seconds in a hydrogen ambient.

Annealing the semiconductor layer 201 results in the formation of a plurality of individual, discrete nanoclusters 301 (also called nanoparticles) which are dispersed over the surface of the insulating layer 111. The anneal causes the semiconductor (e.g., amorphous/polysilicon) layer 201 to dewet from the insulating layer 111 and form nanoclusters 301 that are physically separated from each other. In some embodiments, for example, the nanoclusters 301 can have an average diameter, thickness or height of about 10-30 nm and be separated or spaced from one another by 10-30 nm. Nanoclusters 301 are generally uniformly distributed over the surface of the insulating layer 111, for example, at a density of about 1e11 to 3e11 nanoclusters per $cm^2$.

In some embodiments, for example, polysilicon nanoclusters 301 can be LPCVD nucleated at 620 C followed by their coalescence and insitu doping with boron in an EPI reactor at 800 C. Boron doping can be accomplished through a diborane decomposition reaction which results in an approximately 20%-80% natural split co-doping of $^{10}B$ and $^{11}B$ isotope species.

Figure 4:
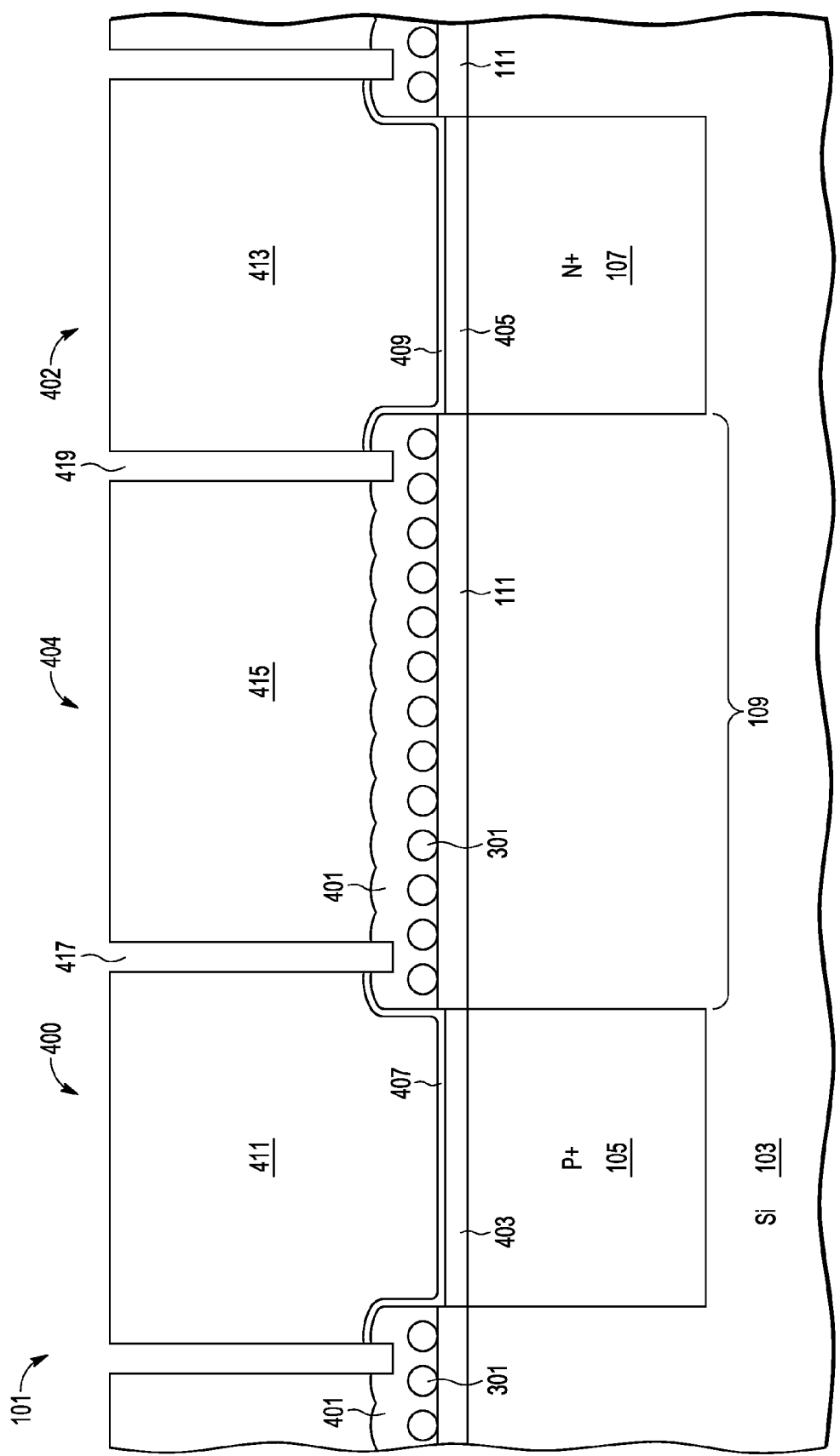
FIG. 4 is a cross-sectional side view of the PIN diode of FIG. 3, at a subsequent stage of manufacture, according to an embodiment of the invention.

FIG. 4 is a cross-sectional side view of the PIN diode of FIG. 3, at a subsequent stage of manufacture, according to an embodiment of the invention, after insulating layer (also referred to as dielectric or oxide layer) 401 has been deposited over nanoclusters 301 and a patterned etch has been performed on insulating layer 111, nanoclusters 301 and insulating layer 401 in a desired pattern that exposes the surface of substrate 103 in a first opening over p-type region 105 and in a second opening over n-type region 107. A conventional masking and etching process can be used to etch insulating layer 111, nanoclusters 301 and insulating layer 401. In some embodiments, the etching can be performed through a patterned mask such as a photoresist or other types of patternable material that can be selectively removed. The mask covers some of insulating layer 401 and leaves desired areas for openings over regions 105, 107 exposed. The exposed areas over regions 105, 107 can then be etched, for example, by a conventional dry or wet etch process.

After the openings over regions 105, 107 are formed, a titanium silicide layer 403, 405 or other suitable material for improving ohmic contact with regions 105, 107 is formed selectively at the bottom of the respective openings. A layer of titanium nitride 407, 409 or other suitable barrier layer is then deposited over titanium silicide layers 403, 405, exposed sidewalls of the openings, and overlapping the top edge of insulating layer 401 adjacent the openings. The titanium nitride layers 407, 409 or other material enables electrical contact to the regions 105, 107 while acting as a diffusion barrier between the underlying titanium silicide layers 403, 405 and metallization to be placed above titanium nitride layers 407, 409.

Electrodes (also referred to as ohmic contacts) 411, 413 are then formed in, above, and slightly overlapping the openings over regions 105, 107. Electrodes 411, 413 can be made of, for example, a patterned layer of aluminum, or other suitable conductive material. The thickness of electrodes 411, 413 is typically about 500 nm to several microns depending on the application. Electrodes 411, 413 can be patterned and etched by using conventional photolithographic processing (e.g., by dry etching) with a mask (not shown). The combination of electrode 411, metallization layer 407, silicide layer 403 and p-type region 105 is referred to herein as p-terminal 400 of PIN diode 101. The combination of electrode 413, metallization layer 409, silicide layer 405, and n-type region 107 is referred to herein as n-terminal 402 of PIN diode 101. The combination of insulating layers 401, 111, nanoclusters 301 and intrinsic region 109 is referred to herein as detection region 404 of PIN diode 101.

In some embodiments, for example, nanoclusters 301 can be encapsulated with a 100-200 nm plasma enhanced chemical vapor deposition undoped silicon glass (USG) cap layer, shown as insulative layer 401, before being lithographically patterned to access the regions 105, 107 for subsequent contact formation. Once open, regions 105, 107 can be selectively silicided with titanium or titanium compound via RTP using a 12 second 685 C anneal resulting in titanium silicide formation. Subsequent metallization with titanium nitride metallization layers 407, 409 can include blanket deposition of a 250 A titanium nitride with 600 nm aluminum copper alloy (0.5% Cu) PVD stack. A chlorine-based endpointed reactive ion etch process can be used to pattern metallization layers 407, 409, 411, 413 with the etch tailored to reduce insulating layer 401 to a thickness of 30-50 nm or lower in the open area from an original thickness ranging from 100-200 nm. Other suitable materials, processes, and thicknesses can be used in other embodiments.

In embodiments where optical isolation is desired, i.e., where detection of visible photons is not required, optical isolator 415 can be added over intrinsic region 109 to block visible photons from reaching intrinsic region 109. Optical isolator 415 can be made of any suitable opaque material, such as aluminum or other suitable material, with a thickness of approximately one micron or other suitable thickness. In other embodiments where visible photon detection is desired, optical isolator 415 will not be included over intrinsic region 109. Optical isolator 415 is formed so that respective gaps 417, 419 remain between optical isolator 415 and each of electrodes 411, 413. For example, material for isolator 415 may be deposited so that the material fills the space between electrodes 411, 413, and then a patterned etch of the material may be performed to remove material directly adjacent electrodes 411, 413 or isolator 415 could be the same material as the electrodes 411, 413 and be patterned concurrently in a single patterning step using conventional lithography and etch steps.

Figure 5:
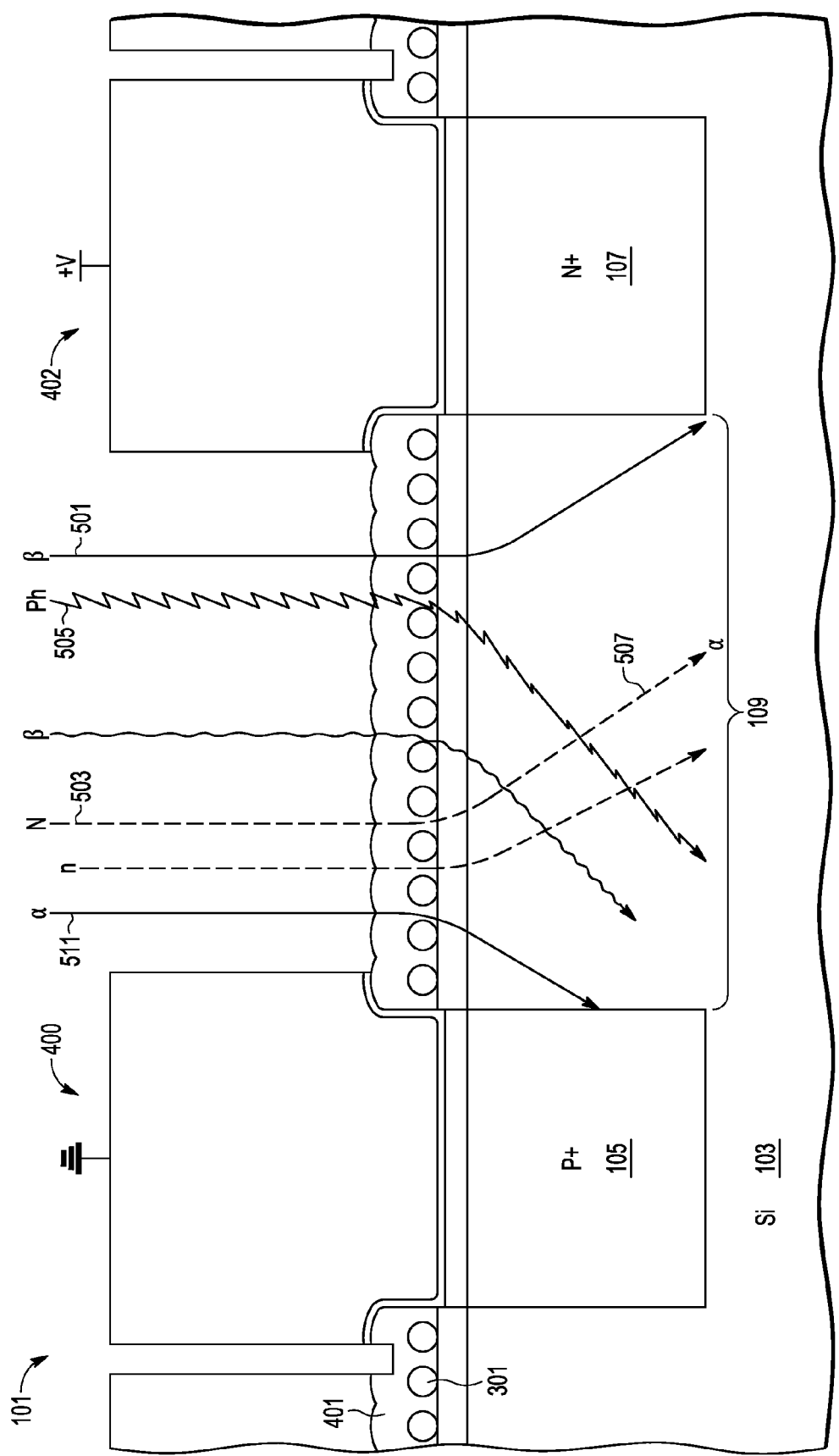
FIG. 5 is a cross-sectional side view of the PIN diode of FIG. 4 showing various types of particles impacting nanoclusters and the intrinsic region, according to an embodiment of the invention.

FIG. 5 is a cross-sectional side view of the PIN diode 101 of FIG. 4 with reverse bias voltages on electrodes 411, 413, that is, p-type region 105 is coupled to a first voltage source through electrode 411 and n-type region 107 is coupled to a second voltage source through electrode 413. PIN diode 101 can be reverse biased with a voltage at the n-type region 107 of 50 mV, or other suitable voltage while p-type region 105 is coupled to ground, for example. Various types of particles are shown being scattered by nanoclusters 301 into intrinsic region 109 including beta particle 501, neutron 503, alpha particle 507 that formed when neutron 503 interacted with the $^{10}B$ isotope in nanoclusters 301, photon 505, and alpha particle 511.

Dipole charge of nanoclusters 301 is indicated by "+" and "−" signs next to each nanocluster 301 in the reverse biased PIN diode electric field. The dipole charge facilitates deflection of charged species such as alpha particle 511 and beta particle 501 into intrinsic region 109, thereby enhancing interaction probability and detection. The magnified electric field at the nanocluster dielectric interface enables enhanced deflection of charged particles improving probability of detection within the underlying PIN diode 101. In particular, charged particles are deflected at the electric dipoles of nanoclusters 301, supplementing physical scattering effects and enhancing the probability of interaction within intrinsic region 109. The three-dimensional shape of nanoclusters 301 creates a further physical effect where photon 505 scatters off adjacent nanoclusters 301 to enhance absorption of photon 505 into intrinsic region 109. Further, the $^{10}$B doping of nanoclusters 301 interacts with neutrons 503 to generate alpha particle 507, allowing neutron strikes to be detected with PIN diode 101. Reducing the thickness of insulating layer 111 can further enhance the sensitivity of PIN diode 101 to photons due to reduced light attenuation in insulating layer 111. For example, a PIN diode 101 with an insulating layer 111 having a thickness of 45 Angstroms exhibited greater sensitivity to visible photons 505 compared to an insulating layer 111 having a thickness of 145 Angstroms.

In some embodiments, intrinsic region 109 may be oriented differently with respect to p-terminal 400 and n-terminal 402 than shown in FIGS. 4 and 5. Further, nanoclusters 301 and insulating layers 401, 111 may be positioned in any suitable orientation and location in which interaction between particles and instrinsic region 109 can be enhanced by the presence of nanoclusters 301.

As used herein, the term "radiation" encompasses pure energy (no mass) such as photons as well as energetic species with mass such as subatomic alpha and beta particles.

Figure 6:
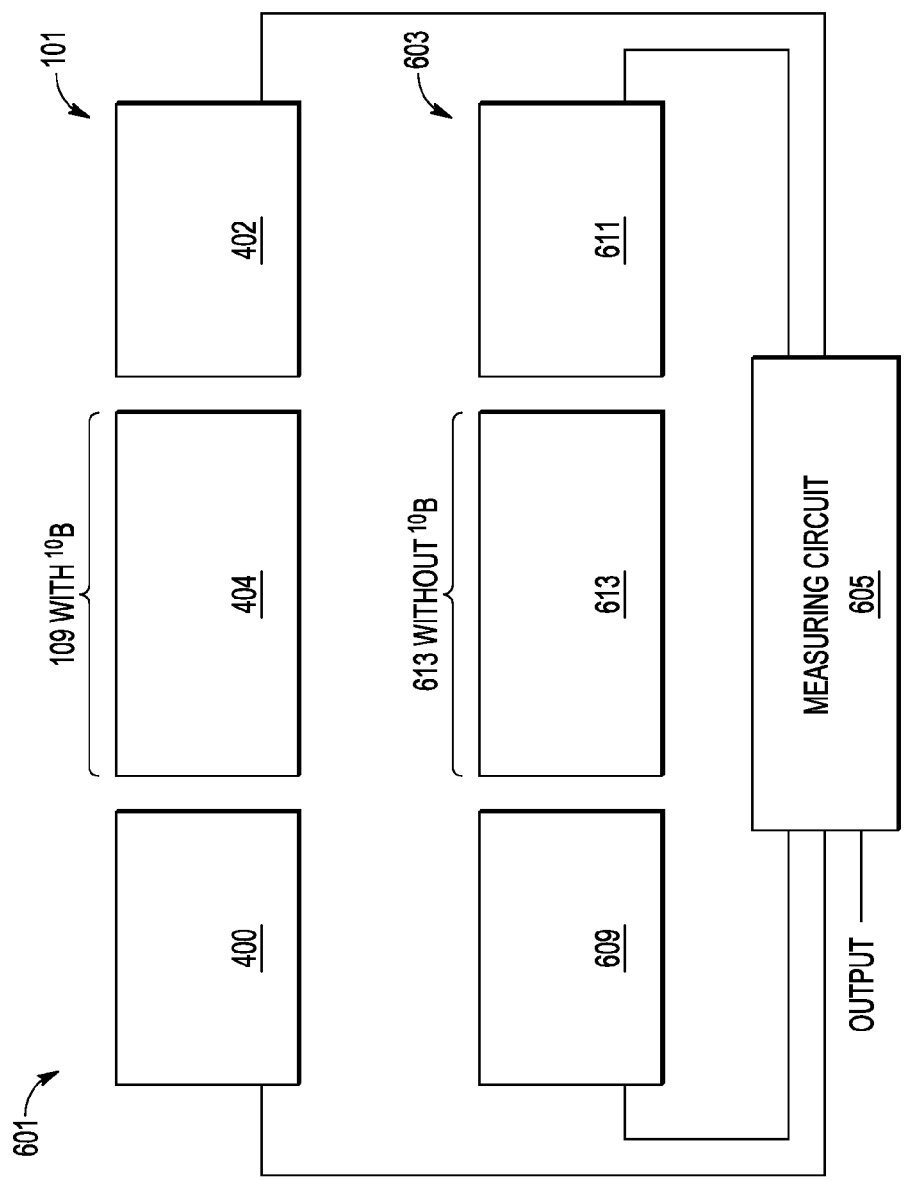
FIG. 6 is block diagram of a sensor system for detecting neutrons using the PIN diode of FIG. 5, according to an embodiment of the invention.

Referring to FIGS. 5 and 6, FIG. 6 is a block diagram of an embodiment of a sensor system 601 for detecting neutrons 503 that includes both PIN diode 101 of FIG. 5 and PIN diode 603 coupled to measuring circuit 605 according to an embodiment of the invention. The components of PIN diode 603 include p-terminal 609 similar to p-terminal 400 of PIN diode 101, n-terminal 611 similar to n-terminal 402 of PIN diode 101, and detection region 613 similar to detection region 404 of PIN diode 101 except detection region 613 does not include nanoclusters (not shown) in detection region 613 or any other primary interaction layer doped with $^{10}$B isotope. PIN diodes 101, 603 are located close enough to one another that a source of neutrons is likely to impact both PIN diodes 101, 603.

P-terminals 400, 609 and n-terminals 402, 611 are independently reverse biased to enable measurement in a common sensing environment. Measuring circuit 605 can supply voltage to bias PIN diodes 101, 603, and can measure one or more electrical characteristics of PIN diodes 101, 603, such as voltage, current, resistance, capacitance, among others. Measuring circuit 605 can include any suitable measuring devices, such as a charge sensitive amplifier, oscilloscope, and/or comparator, etc.

An output of measuring circuit 605 can indicate the difference in a measured electrical characteristic of PIN diodes 101, 603. When neutrons 503 impact detection region 404 of PIN diode 101, the interaction of neutrons 503 with the $^{10}$B isotope in nanoclusters 301 will generate alpha particles 507 and create current through PIN diode 101. Since PIN diode 603 does not include nanoclusters 301 doped with the $^{10}$B isotope, PIN diode 603 will not generate alpha particles 507 from neutrons 503. The difference in current between PIN diode 101 and PIN diode 603 indicates a neutron strike since PIN diode 603 is not capable of generating alpha particles 507 from neutron 503 and therefore would be insensitive to it. Note that if both PIN diodes 101, 603 are struck by alpha particles 511, alpha particles 511 will be detected by both PIN diodes 101, 603 rendering the differential current between the two to be essentially zero.

Figure 7:
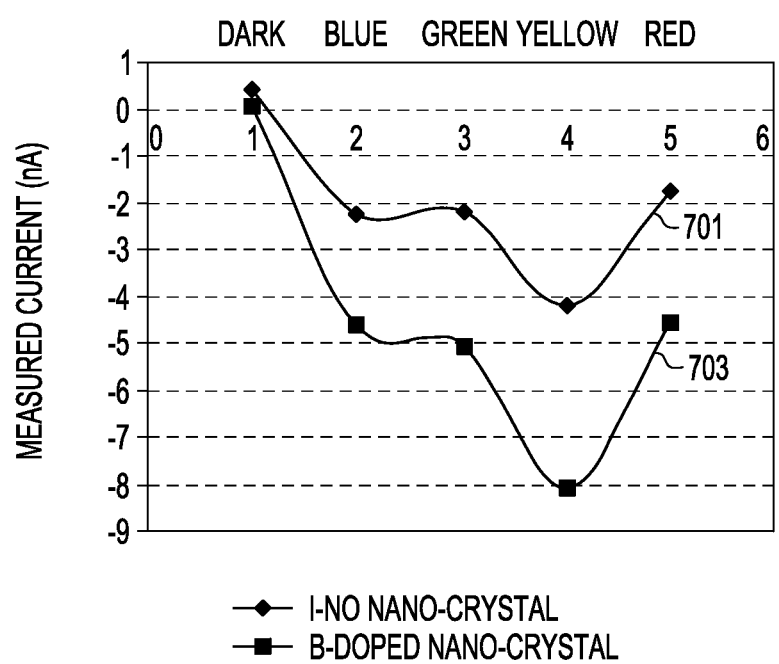
FIG. 7 is a set of graphs showing example test results of the spectral response of the PIN diode of FIG. 5 compared to a conventional PIN diode without nanoclusters.

Referring to FIGS. 5 and 7, FIG. 7 is a set of graphs 701, 703 showing test results of the spectral response of PIN diode 101 compared to a conventional PIN diode without nanoclusters 301 in the visible wavelength. Graph 701 shows photo electric current measured by PIN diode 603 and graph 703 shows current measure in PIN diode 101 in response to photons in the visible wavelength range including blue, green, yellow and red wavelength regions. Table 1 below shows an enhancement ratio of current in nano-Amperes in PIN diode 101 relative to current in PIN diode 603 at each wavelength region shown by graphs 701 and 703:

TABLE 1

| Visible Wavelength Region | Current in PIN Diode 101 (nA) | Current in PIN Diode 603 (nA) | Enhancement Ratio |
|---|---|---|---|
| Blue | −4.6 | −2.2 | 2.1 |
| Green | −5 | −2.1 | 2.4 |
| Yellow | −8.1 | −4.1 | 2.0 |
| Red | −4.6 | −1.8 | 2.6 |

As the results of graphs 701 and 703 show, PIN diode 101 is more sensitive to photon detection than PIN diode 603. The difference in sensitivity peaks in the yellow wavelength region with a difference of 4 nA between current in PIN diode 101 and PIN diode 603, but is still significant in the blue, green and red wavelength regions. The enhanced photoelectric response of PIN diode 101 compared to PIN diode 603 is due to scattering of photons by nanoclusters 301, which effectively increases interaction probability and hence absorption in intrinsic region 109.

A measurement system for detecting alpha particles can include output from PIN diode 101 being provided to a charge sensitive amplifier module such as the Cremat CR-Z-110 by Cremat Corporation in West Newton, Mass. In one test, the amplified output of the amplifier was input to an oscilloscope. Test results showed the comparison of the charge sensitive amplifier output for conditions where no alpha particles were present, and in conditions where a thorium source of alpha particles with a fluence of 70/cm$^2$/sec and a peak energy of 4 MeV was present in the vicinity of PIN diode 101. A voltage spike seen with a peak-to-peak amplitude of 101 mV shown on the oscilloscope was an artifact of a hit by an alpha particle, which PIN diode 101 was able to detect at a 5:1 signal to noise ratio.

Table 2 shows results from another example test in which three different configurations of PIN diodes 101, 603 were subjected to ultraviolet light with a wavelength of 253.6 nm and power of 15 Watts. In a first configuration, p-terminals 400, 609 and n-terminals 402, 611 were spaced 0.5 microns apart. In a second configuration, p-terminals 400, 609 and n-terminals 402, 611 were spaced 2.0 microns apart, and in a third configuration, p-terminals 400, 609 and n-terminals 402, 611 were spaced 4.0 microns apart.

TABLE 2

| Electrode Spacing (microns) | Current in PIN Diode 101 (nA) | Current in PIN Diode 603 (nA) | Enhancement Ratio |
|---|---|---|---|
| 0.5 | −45 | −24 | 1.9 |
| 2.0 | −63 | −37 | 1.7 |
| 4.0 | −80 | −48 | 1.7 |

The ratio of current generated in PIN diode 101 to current generated in PIN diode 603 is highest at a spacing of 0.5 microns between p-terminals 400, 609 and n-terminals 402, 611, and approximately the same at spacings of 2.0 and 4.0 microns between p-terminals 400, 609 and n-terminals 402, 611.

By now, it should be appreciated that a radiation sensing device has been provided that includes a reverse biased PIN diode 101 with $^{10}$B nanoclusters 301 connected in parallel with the intrinsic region 109, and a thin insulative layer 111 between the nanoclusters 301 and intrinsic region 109. PIN diode 101 thereby is designed to synergistically enhance the capability and versatility of conventional PIN diodes enabling higher sensitivity and broader range of photo and ionization detection at reduced cost.

In some embodiments, a diode for detecting the presence of radiation can include a P region, an N region, an intrinsic region located between the P region and the N region, and a layer of nanoclusters located adjacent to the intrinsic region.

In another aspect, the diode can further comprise a dielectric layer located between the layer of nanoclusters and the intrinsic layer.

In another aspect, the nanoclusters can be characterized as silicon nanocrystals.

In another aspect, the nanoclusters can be doped with a material that generates alpha particles upon interactions with neutrons.

In another aspect, the material can include $^{10}$B isotope.

In another aspect, the intrinsic region can be characterized as monocrystalline silicon.

In another aspect, the nanoclusters can have an average height or thickness in the range of 10-30 nm.

In another aspect, the nanoclusters can have an average spacing in the range of 10-30 nm.

In another aspect, the P region is located in a substrate, the N region is located in the substrate, the intrinsic region is located in the substrate between the P region and the N region, and the layer of nanoclusters is located over the intrinsic region.

In another aspect, the diode can further comprise a visible light blocking structure. The layer of nanoclusters can be located between the intrinsic region and the visible light blocking structure.

In another aspect, the diode can further comprise a first electrode in ohmic contact with the P region, and a second electrode in ohmic contact with the N region. The first electrode and the second electrode can each include a conductive structure. The conductive structure of the first electrode, the conductive structure of the second electrode, and the blocking structure can be predominately made of a first material.

In another aspect, the first material can be at least 90% aluminum by weight percent.

In another aspect, the nanoclusters can be of a material, dimension, and spacing that causes at least one of the group consisting of photons and charged particles to change direction upon leaving the layer of nanoclusters.

In other embodiments, a device for detecting radiation can comprise a diode that can include a P region, an N region, an intrinsic region located between the P region and the N region, a layer of nanoclusters located adjacent to the intrinsic region, and a measuring circuit having a first terminal electrically coupled to P region and a second terminal coupled to the N region. The measuring circuit can be configured to provide an indication of the presence of radiation induced electrons in the intrinsic region.

In another aspect, the measuring system can be configured to detect the presence of radiation induced electrons in the intrinsic region by measuring a current flowing through the intrinsic region.

In another aspect, the nanoclusters can be doped with a material that generates alpha particles upon interactions with neutrons.

In another aspect, the diode can further comprise a second diode including a second P region, a second N region, a second intrinsic region located between the second P region and the second N region, and a second layer of nanoclusters located adjacent to the second intrinsic region. The second layer of nanoclusters can be substantially free of the material that generates alpha particles upon interactions with neutrons.

In still other embodiments, a method of making a diode can include forming a P region of a diode in a substrate, and forming an N region of the diode in the substrate. The N region can be separated from the P region by an intrinsic region of the diode in the substrate. A layer of nanoclusters can be formed over the substrate. A portion of the layer of nanoclusters can be removed from over the N region and the P region while leaving substantially all of the layer of nanoclusters over the intrinsic region.

In another aspect, the layer of nanoclusters can be in situ doped with a material that generates alpha particles upon interactions with neutrons.

In another aspect, the method can further comprise forming a first electrode in ohmic contact with the P region, forming a second electrode in ohmic contact with the N region, and forming a visible light blocking structure over the intrinsic region and over the layer of nanoclusters. A portion of the light blocking structure can be in a same lateral plane parallel to the substrate as a portion of the first electrode and a portion of the second electrode.

The terms "top," "bottom," "over," "under," "overlying," "underlying," and the like in the description and in the claims, if any, are used for descriptive purposes and may, but do not necessarily, describe permanent relative positions. It is understood that the terms so used may be interchangeable under appropriate circumstances such that the embodiments of the invention described herein are, for example, capable of operation in other orientations than those illustrated or otherwise described herein.

The terms "a" or "an," as used herein, are defined as one or more than one. Also, the use of introductory phrases such as "at least one," "at least two," and "one or more" in the claims should not be construed to imply that the introduction of another claim element by the indefinite articles "a" or "an" limits any particular claim containing such introduced claim element to devices, etc., containing only one such element, even when the same claim includes the introductory phrases "one or more" or "at least one" and indefinite articles such as "a" or "an." The same applies to the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required or essential feature or element of any or all of the claims.

What is claimed:

1. A diode for detecting the presence of radiation comprising:
   a P region;
   an N region;
   an intrinsic region located between the P region and the N region;
   a layer of nanoclusters located adjacent to the intrinsic region, wherein the nanoclusters are doped with a material that generates alpha particles upon interactions with neutrons.

2. The diode of claim 1 further comprising:
   a dielectric layer located between the layer of nanoclusters and the intrinsic region.

3. The diode of claim 1 wherein the nanoclusters are characterized as silicon nanocrystals.

4. The diode of claim 1 wherein the material includes $^{10}$B isotope.

5. The diode of claim 1 wherein the intrinsic region is characterized as monocrystalline silicon.

6. The diode of claim 1 wherein the nanoclusters have an average height in the range of 10-30 nm.

7. The diode of claim 1 wherein the nanoclusters have an average spacing in the range of 10-30 nm.

8. The diode of claim 1 wherein the P region is located in a substrate, the N region is located in the substrate, the intrinsic region is located in the substrate between the P region and the N region, and the layer of nanoclusters is located over the intrinsic region.

9. The diode of claim 1 further comprising a visible light blocking structure, the layer of nanoclusters is located between the intrinsic region and the visible light blocking structure.

10. The diode of claim 9 further comprising:
    a first electrode in ohmic contact with the P region;
    a second electrode in ohmic contact with the N region;
    wherein the first electrode and the second electrode each include a conductive structure, the conductive structure of the first electrode, the conductive structure of the second electrode, and the blocking structure are predominately made of a first material.

11. The diode of claim 10 wherein the first material is at least 90% aluminum by weight percent.

12. The diode of claim 1 wherein the nanoclusters are of a material, dimension, and spacing that causes at least one of the group consisting of photons and charged particles to change direction upon leaving the layer of nanoclusters.

13. A device for detecting radiation, the device comprising:
    a diode, the diode comprising:
       a P region;
       an N region;
       an intrinsic region located between the P region and the N region;
       a layer of nanoclusters located adjacent to the intrinsic region;
    a measuring circuit having a first terminal electrically coupled to P region and a second terminal coupled to the N region, the measuring circuit configured to provide an indication of the presence of radiation induced electrons in the intrinsic region.

14. The device of claim 13 wherein the measuring circuit is configured to detect the presence of radiation induced electrons in the intrinsic region by measuring a current flowing through the intrinsic region.

15. The device of claim 13 wherein the nanoclusters are doped with a material that generates alpha particles upon interactions with neutrons.

16. The device of claim 15 further comprising:
    a second diode comprising:
       a second P region;
       a second N region;
       a second intrinsic region located between the second P region and the second N region;
       a second layer of nanoclusters located adjacent to the second intrinsic region, wherein the second layer of nanoclusters is substantially free of the material that generates alpha particles upon interactions with neutrons.

17. A diode comprising:
    a P region of a diode in a substrate;
    an N region of the diode in the substrate, the N region separated from the P region by an intrinsic region of the diode in the substrate;
    a layer of nanoclusters only over the substrate over the intrinsic region, wherein the layer of nanoclusters is in situ doped with a material that generates alpha particles upon interactions with neutrons.

18. The diode of claim 17 further comprising:
    a first electrode in ohmic contact with the P region;
    a second electrode in ohmic contact with the N region;
    a visible light blocking structure over the intrinsic region and over the layer of nanoclusters, a portion of the light blocking structure is in a same lateral plane parallel to the substrate as a portion of the first electrode and a portion of the second electrode.

* * * * *